United States Patent
Drogi et al.

(10) Patent No.: US 8,022,761 B2
(45) Date of Patent: *Sep. 20, 2011

(54) ERROR DRIVEN RF POWER AMPLIFIER CONTROL WITH INCREASED EFFICIENCY

(75) Inventors: Serge Francois Drogi, Flagstaff, AZ (US); Vikas Vinayak, Menlo Park, CA (US); Martin Tomasz, San Francisco, CA (US)

(73) Assignee: Quantance, Inc., San Mateo, CA (US)

(*) Notice: Subject to any disclaimer, the term of this patent is extended or adjusted under 35 U.S.C. 154(b) by 407 days.

This patent is subject to a terminal disclaimer.

(21) Appl. No.: 12/268,978

(22) Filed: Nov. 11, 2008

(65) Prior Publication Data

US 2009/0068966 A1   Mar. 12, 2009

Related U.S. Application Data

(63) Continuation of application No. 11/750,821, filed on May 18, 2007, now Pat. No. 7,466,195.

(51) Int. Cl.
*H03G 3/20* (2006.01)
(52) U.S. Cl. .......... 330/136; 330/297; 330/149
(58) Field of Classification Search .......... 330/136, 330/297, 149
See application file for complete search history.

(56) References Cited

U.S. PATENT DOCUMENTS

| | | | |
|---|---|---|---|
| 3,900,823 A | 8/1975 | Sokal et al. | |
| 4,420,723 A | 12/1983 | de Jager | |
| 5,142,240 A | 8/1992 | Isota et al. | |
| 5,420,536 A * | 5/1995 | Faulkner et al. | 330/149 |
| 5,675,288 A | 10/1997 | Peyrotte et al. | |
| 5,822,442 A | 10/1998 | Agnew et al. | |
| 5,880,633 A | 3/1999 | Leizerovich et al. | |
| 6,133,792 A | 10/2000 | Hansson | |
| 6,141,541 A | 10/2000 | Midya et al. | |
| 6,166,596 A | 12/2000 | Higashiyama et al. | |
| 6,175,273 B1 | 1/2001 | Sigmon et al. | |
| 6,300,826 B1 | 10/2001 | Mathe et al. | |
| 6,353,359 B1 | 3/2002 | Leizerovich | |
| 6,377,784 B2 | 4/2002 | McCune | |

(Continued)

FOREIGN PATENT DOCUMENTS

EP    0812064 B1    12/1997

(Continued)

OTHER PUBLICATIONS

"The Changing Face of Amplifier Design," Nujira, [online] [Retrieved on Apr. 5, 2006] Retrieved from the Internet<URL:http://www.nujira.com/technology/>.

(Continued)

*Primary Examiner* — Patricia Nguyen
(74) *Attorney, Agent, or Firm* — Fenwick & West LLP

(57) ABSTRACT

A power amplifier controller for adjusting a supply voltage to a power amplifier. The power amplifier controller adjusts the supply voltage so that distortion in an RF output signal corresponds to a predetermined limit. An amplitude error signal is generated by the power amplifier controller which represents a difference between an RF output signal and an attenuated RF output signal. The AC components of the amplitude error signal are processed to generate a deviation signal that represents the distortion in the RF output signal. The supply voltage to the power amplifier is increased when the deviation signal exceeds a distortion level control signal, and decreased when the deviation signal drops below the distortion level control signal.

33 Claims, 8 Drawing Sheets

U.S. PATENT DOCUMENTS

| | | | |
|---|---|---|---|
| 6,404,823 | B1 | 6/2002 | Grange et al. |
| 6,437,641 | B1 * | 8/2002 | Bar-David ................. 330/10 |
| 6,445,249 | B1 | 9/2002 | Khan et al. |
| 6,472,934 | B1 | 10/2002 | Pehlke |
| 6,528,975 | B2 | 3/2003 | Sander |
| 6,583,664 | B2 | 6/2003 | Mathe et al. |
| 6,661,210 | B2 | 12/2003 | Kimball et al. |
| 6,781,452 | B2 | 8/2004 | Cioffi et al. |
| 6,917,244 | B2 | 7/2005 | Rosnell et al. |
| 6,924,695 | B2 | 8/2005 | Cioffi et al. |
| 6,924,700 | B2 | 8/2005 | Taura |
| 6,924,711 | B2 * | 8/2005 | Liu ............................ 332/159 |
| 7,058,373 | B2 | 6/2006 | Grigore |
| 7,197,286 | B2 | 3/2007 | Ode et al. |
| 7,248,846 | B2 * | 7/2007 | Kayano et al. ............ 455/127.3 |
| 7,755,422 | B2 * | 7/2010 | Schell et al. ................. 330/10 |
| 7,777,566 | B1 * | 8/2010 | Drogi et al. ................ 330/136 |
| 7,944,294 | B2 * | 5/2011 | Jones et al. ................. 330/127 |
| 2002/0053897 | A1 | 5/2002 | Kajiwara et al. |
| 2002/0168949 | A1 | 11/2002 | Johannisson et al. |
| 2003/0017840 | A1 | 1/2003 | Katagishi et al. |
| 2003/0155978 | A1 | 8/2003 | Pehlke |
| 2004/0071225 | A1 | 4/2004 | Suzuki et al. |
| 2004/0162039 | A1 | 8/2004 | Marque-Pucheu |
| 2004/0189378 | A1 | 9/2004 | Suzuki et al. |
| 2004/0263254 | A1 | 12/2004 | Tahara et al. |
| 2005/0064830 | A1 | 3/2005 | Grigore |
| 2005/0122163 | A1 | 6/2005 | Chu |
| 2005/0156662 | A1 | 7/2005 | Raghupathy et al. |
| 2005/0242880 | A1 | 11/2005 | Domokos et al. |
| 2006/0001483 | A1 | 1/2006 | Cioffi et al. |
| 2007/0096806 | A1 | 5/2007 | Sorrells et al. |

FOREIGN PATENT DOCUMENTS

WO          WO 9534128 A1    12/1995

OTHER PUBLICATIONS

Fergus, T.J., "EDGE Modulation—How Linearization Improves Amplifier Performance," RFDesign, Oct. 2002, 7 pages.

"LF-2.7 GHz RF/IF Gain and Phase Detector, AD8302," Analog Devices, Inc., 2002, [online] [Retrieved on Apr. 5, 2006] Retrieved from the Internet<URL:http://www.analog.com/UploadedFiles/Data_Sheets/797075782AD8302_a.pdf#search='AD8302'>.

McCune, Jr., E.W., "Direct Polar Modulation has the Right Stuff," CommsDesign, Nov. 7, 2005, [online] [Retrieved on Apr. 5, 2006] Retrieved from the Internet<URL:http://www.commsdesign.com/showArticle.jhtm?articleID=173500205>.

Morgan, P., "Highly Integrated Transceiver Enables High-Volume Production of GSM/EDGE Handsets," Silicon Laboratories, Inc., 2005, 6 pages, [online] [Retrieved on Apr. 5, 2006] Retrieved from the Internet<URL:http://www.silabs.com/public/documents/marcom_doc/mcoll/Wireless/Aero_RF_Transceivers/en/Aerolle_Overview.pdf>.

PCT International Search Report and Written Opinion, PCT/US08/61176, Aug. 21, 2008, 9 pages.

Raab, F. et al., "RF and Microwave Power Amplifier and Transmitter Technologies—Part 3," High Frequency Electronics, Sep. 2003, pp. 34-48.

Raab, F. et al., "RF and Microware Power Amplifier and Transmitter Technologies—Part 4," High Frequency Electronics, Nov. 2003, pp. 38-49.

"SEQ5400—The World's First Single-Chip WEDGE Transceiver," Sequoia Communications, [online] [Retrieved on Apr. 5, 2006] Retrieved from the Internet<URL:http:www.sequoia-communications.com/SEQ5400Data_Sheet.pdf>.

Sowlati, T. et al., "Polar Loop Transmitter," Skyworks™, [online] [Retrieved on Apr. 5, 2006] Retrieved from the Internet<URL:http://paworkshop.ucsd.edu/papers2004/S1_2Polar%20Loop%/20Transmitter.ppt>.

Wilkins, B. et al., "Large Signal Polar Modulation Reduces Heat Dissipation and Increases Battery Life in EDGE Handsets" Feb. 2005, Microwave Product Digest, [online] [Retrieved on Apr. 5, 2006] Retrieved from the Internet<URL:http:www.mpdigest.com/Articles/2005/feb2005/rfmd/Default.htm>.

* cited by examiner

ERROR DRIVEN RF POWER AMPLIFIER CONTROL WITH INCREASED EFFICIENCY

CROSS-REFERENCE TO RELATED APPLICATIONS

This application is a continuation application, and claims priority under 35 U.S.C. §120 to co-copending U.S. patent application Ser. No. 11/750,821 entitled "Error Driven RF Power Amplifier Control with Increased Efficiency" filed on May 18, 2007, which is incorporated herein by reference in its entirety.

BACKGROUND OF THE INVENTION

1. Field of the Invention

The present invention relates to a circuit for controlling RF PAs (Radio Frequency Power Amplifiers), and more specifically, to an RF PA controller circuit that adjusts the supply voltage of RF PAs.

2. Description of the Related Art

RF (Radio Frequency) transmitters and RF power amplifiers are widely used in portable electronic devices such as cellular phones, laptop computers, and other electronic devices. RF transmitters and RF power amplifiers are used in these devices to amplify and transmit the RF signals remotely. RF PAs are one of the most significant sources of power consumption in these electronic devices, and their efficiency has a significant impact on the battery life of these portable electronic devices. For example, cellular telephone makers make great efforts to increase the efficiency of the RF PA systems, because the efficiency of the RF PAs is one of the most critical factors determining the battery life of the cellular telephone and its talk time.

FIG. 1 illustrates a conventional RF transmitter circuit, including a transmitter integrated circuit (TXIC) 102 and an external power amplifier (PA) 104. In some cases, there may be a filter between the TXIC 102 and the PA 104. For example, the RF transmitter circuit may be included in a cellular telephone device using one or more cellular telephone standards (modulation techniques) such as UMTS (Universal Mobile Telephony System) or CDMA (Code Division Multiple Access), although the RF transmitter circuit may be included in any other type of RF electronic devices. For purposes of illustration only, the RF transmitter circuit will be described herein as a part of a cellular telephone device. The TXIC 102 generates the RF signal 106 to be amplified by the PA 104 and transmitted 110 remotely by an antenna (not shown). For example, the RF signal 106 may be an RF signal modulated by the TXIC 102 according to the UMTS or CDMA standard.

The RF power amplifier 104 in general includes an output transistor (not shown) as its last amplification stage. When an RF modulated signal 106 is amplified by the PA 104, the output transistor tends to distort the RF modulated signal 106, resulting in a wider spectral occupancy at the output signal 110 than at the input signal 106. Since the RF spectrum is shared amongst users of the cellular telephone network, a wide spectral occupancy is undesirable. Therefore, cellular telephone standards typically regulate the amount of acceptable distortion, thereby requiring that the output transistor fulfill high linearity requirements. In this regard, when the RF input signal 106 is amplitude-modulated, the output transistor of the PA 104 needs to be biased in such a way that it remains linear at the peak power transmitted. This typically results in power being wasted during the off-peak of the amplitude of the RF input signal 106, as the biasing remains fixed for the acceptable distortion at the peak power level.

Certain RF modulation techniques have evolved to require even more spectral efficiency, and thereby forcing the PA 104 to sacrifice more efficiency. For instance, while the efficiency at peak power of an output transistor of the PA 104 can be above 60%, when a modulation format such as WCDMA is used, with certain types of coding, the efficiency of the PA 104 falls to below 30%. This change in performance is due to the fact that the RF transistor(s) in the PA 104 is maintained at an almost fixed bias during the off-peak of the amplitude of the RF input signal 106.

Certain conventional techniques exist to provide efficiency gains in the PA 104. One conventional technique is EER (Envelope Elimination and Restoration). The EER technique applies the amplitude signal (not shown in FIG. 1) and the phase signal (not shown in FIG. 1) of the RF input signal 106 separately to 2 ports of the power amplifier 104, i.e., its supply voltage port (Vcc) 108 and its RF input port 107, respectively. However, the EER technique often fails to provide significant efficiency gains, because the supply voltage 108 cannot be varied in an energy-efficient way to accommodate the large variations in the amplitude signal of the RF input signal 106; and thus, it fails to provide a substantial energy efficiency gain while maintaining the required linear amplification of the RF signal in the PA 104. This is mainly due to the difficulty in realizing a fast, accurate, wide range, and energy efficient voltage converter to drive the supply voltage of the PA 104.

The conventional EER technique can function better only if a variable power supply with a very large variation range is used to adjust the supply voltage based on the amplitude signal of the RF input signal 106, while not reducing the efficiency of the RF transmitter by the power consumed by the power supply itself. However, the variable power supply, which is typically comprised of a linear regulator (not shown in FIG. 1) that varies its output voltage on a fixed current load such as the PA 104 in linear mode, by principle reduces the supply voltage at constant current and by itself consumes the power resulting from its current multiplied by the voltage drop across the linear regulator when there is a large drop in the amplitude signal of the RF input signal 106. This results in no change in the overall battery power being consumed by the RF transmitter because any efficiency gained in the PA 104 is mostly lost in the linear regulator itself.

Variations of the EER technique, such as Envelope Following and other various types of polar modulation methods, likewise fails to result in any significant gain in efficiency in the RF transmitter, because the supply voltage is likewise adjusted based on the amplitude signal of the RF input signal 106 which inherently has large variations; and thus, has the same deficiencies as described above with respect to conventional EER techniques.

Some other conventional techniques improve the efficiency in the PA 104 by lowering the supply voltage 108 to the PA 104. In many of these techniques, both amplitude and phase components of the RF input signal 106 are fed to the PA 104 in a conventional manner. By using a lower supply voltage 108, the PA 104 operates with increased power efficiency because it operates closer to the saturation point. However, the supply voltage 108 cannot be reduced too low, because this would cause the PA 104 to operate with insufficient voltage headroom, resulting in unacceptable distortion. As described previously, the distortion may cause energy from the transmitted signal to spill over to adjacent channels, increasing spectral occupancy and causing interference to radios operating in those neighboring channels. Thus, an optimal supply voltage can be chosen for the PA which balances acceptable distortion with good efficiency.

One conventional method uses a step-down switched mode power supply (SMPS) (i.e., buck regulator) to lower the supply voltage 108 to the PA 104. However, choosing a fixed power supply voltage is not sufficient in many applications. For example, in most cellular systems, the PA output power changes frequently because the basestation commands the cellular handset to adjust its transmitted power to improve network performance, or because the handset changes its transmitted information rate. When the PA output power changes, the optimum supply voltage for the PA (as described above) changes.

Therefore, in some systems, the expected power of the RF output signal 110 is first determined, and then the power supply voltage 108 is adjusted in accordance with the expected power. By adaptively adjusting the supply voltage 108, the efficiency of the PA 104 is increased across various PA output power levels. Conventional methods estimate the expected power of the RF output signal 110 in an "open loop" manner, in which the power of the RF output signal 110 is estimated from the power of the delivered RF input signal 106. This method does not yield an accurate estimate of the power of the RF output signal 110 because the estimated power may vary according to various operating conditions, such as temperature and frequency. Therefore, even if the estimated power at some point approximates the actual power, changes in operating conditions result in deviation of the estimated power from the actual power.

Moreover, an estimate of the power of the RF output signal 110 may not be sufficient for properly adjusting the supply voltage 108. For example, the peak-to-average ratio (PAR) needs to be known in order to estimate the optimum supply voltage for the PA. The PAR refers to the difference of the mean amplitude and the peak amplitude in the modulated RF output signal 110. With a higher PAR, a higher supply voltage is needed to accommodate the peak voltage swings of the RF output signal 110. Many modern cellular systems change the PAR of the modulation in real time, requiring the supply voltage to be adjusted accordingly. Therefore, the conventional method of adjusting the supply voltage 108 of PA 104 based on an estimate of the PA output power is unsuitable in these cellular systems.

Further, the load presented to the PA 104 poses another problem. The PA 104 normally drives circuitry usually consisting of a filter and an antenna. Such circuitry often has an impedance around the range of 50 ohms. The impedance of the circuitry can sometime change radically. For example, if the antenna is touched or the cellular device is laid down on a metal surface, the impedance of the circuitry changes. The changes in the impedance of the circuitry coupled to the PA 104 may require changes in the supply voltage to the PA 104 to prevent distortion of the RF output signal 110 fed to this circuitry. The conventional methods described above, however, do not adjust the supply voltage in response to changes in the impedance of the circuitry.

Although the problems of inaccurate estimation of power at the RF output signal 110, changing PAR, and impedance changes at the output of PA 104 can be avoided by constantly providing a higher than optimum supply voltage to the PA 104, the higher supply voltage leads to a less efficient PA 104.

Thus, there is a need for a PA system that is efficient over a wide variety of modulation techniques and results in a significant net increase in power efficiency of the PA system. Additionally, there is a need for a PA controller that can adjust the power supply for the PA under conditions of varying temperature, frequency, output power, PAR, and impedance to maximize the PA efficiency while keeping distortion to an acceptable level.

SUMMARY OF THE INVENTION

In a first embodiment of the present invention, a power amplifier controller adjusts supply voltage to a power amplifier so that the distortion of the RF output signal from the power amplifier corresponds to a predetermined level. In this embodiment, an amplitude difference between an amplitude of a RF input signal and an attenuated amplitude of the RF output signal is determined to generate an amplitude error signal. Then, a deviation signal is determined from a measured level of activity of the amplitude error signal to indicate the level of distortion in the output signal. The deviation signal is then compared with a predetermined distortion level control signal, to generate a supply voltage control signal, which in turn adjusts the supply voltage to the power amplifier. The distortion level control signal is set to represent an acceptable distortion level at the RF output signal. Thus, a control loop is created to servo the supply voltage to the power amplifier in a manner which targets an acceptable distortion level in the RF output signal.

In a second embodiment, the power amplifier controller includes a variable gain amplifier (VGA) coupled to the power amplifier for adjusting the amplitude of the RF input signal ahead of the power amplifier. The VGA is adjusted by a gain control signal based on the amplitude error signal; and thus, operates in a closed loop manner in which the VGA adjusts the input to the power amplifier to provide some correction for distortion at the RF output signal. This distortion correction allows the PA to operate closer to its saturation point; and thus, allows further decrease in a supply voltage to the PA compared to the first embodiment, thereby further increasing the PA's efficiency.

In a third embodiment, the VGA is included as in the second embodiment, but the deviation signal is determined from the time-varying gain of the VGA, which is indicative of the correction applied by the VGA, and therefore indicative of the distortion in the RF output signal. An advantage of this embodiment is that the time-varying gain of the VGA can be measured at the relatively large signal which controls the VGA's gain, providing a preferred method of indicating the distortion in the RF output signal.

An advantage of the power amplifier controller according to the embodiments of the present invention is that it greatly increases the efficiency of the power amplifier by keeping the supply voltage of the power amplifier as low as possible while maintaining the distortion of the output signal near a predetermined level. Moreover, because the supply voltage of the power amplifier is adjusted according to the level of distortion in the output signal, the supply voltage can be accurately established, thus maximizing the overall efficiency of the power amplifier.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the present invention can be readily understood by considering the following detailed description in conjunction with the accompanying drawings.

DETAILED DESCRIPTION OF EMBODIMENTS

The Figures (FIG.) and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made to several embodiments of the present invention(s), examples of which are illustrated in the accompanying figures. Wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Figure 1:
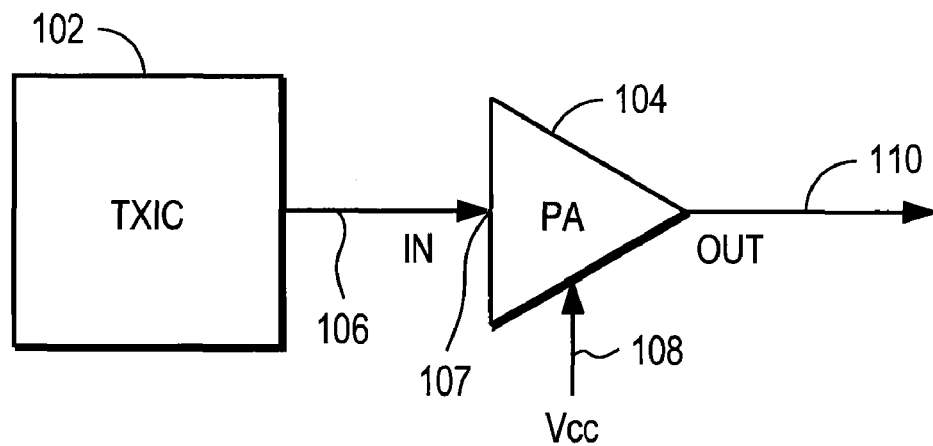
FIG. 1 illustrates a conventional RF transmitter circuit.
Figure 2:
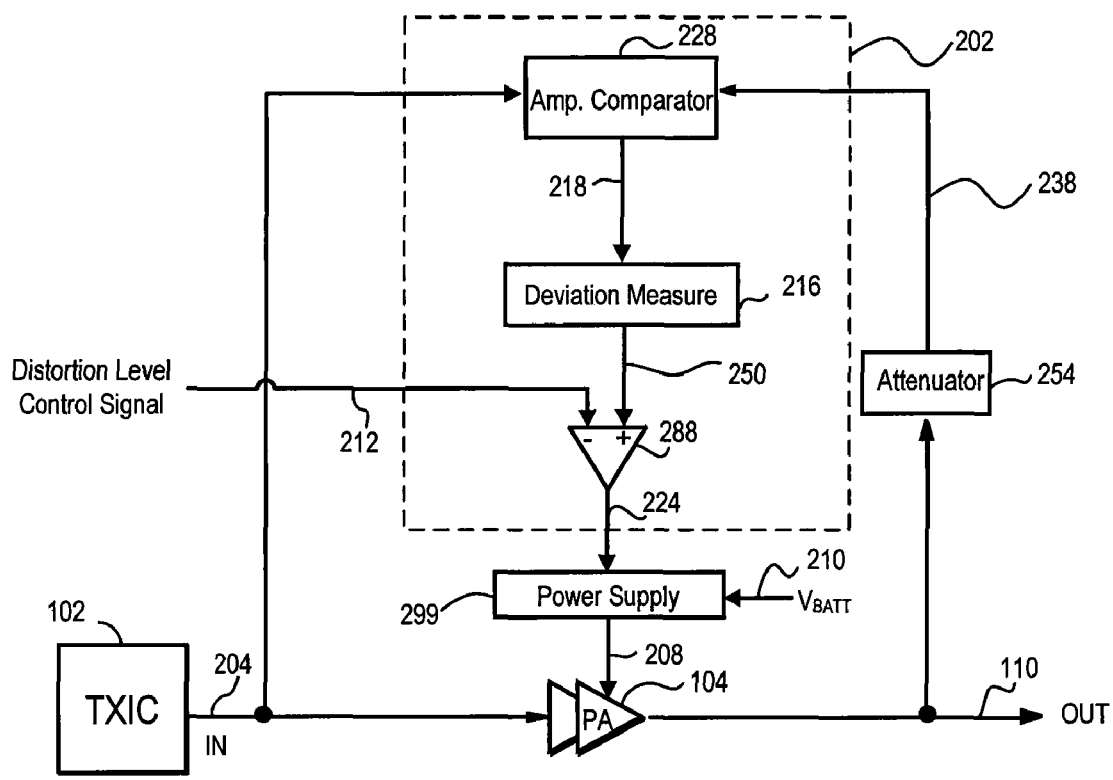
FIG. 2 illustrates a schematic diagram of an RF transmitter circuit including a PA controller in accordance with the present invention.

FIG. 2 illustrates a schematic diagram of an RF transmitter circuit including a PA controller 202 in accordance with the present invention. The overall function of PA controller 202 is to adjust the supply voltage 208 to a PA 104 to a level as low as possible while maintaining the distortion of the RF output signal 110 near an acceptable limit (e.g. a limit defined by standards covering the RF device, such as 3GPP specifications). By keeping the supply voltage 208 of the PA 104 as low as possible, the efficiency of the PA 104 is increased greatly.

The RF transmitter circuit of FIG. 2 includes, among other components, a transmitter integrated circuit (TXIC) 102, a PA controller 202, a power supply 299, an attenuator 254, and the PA 104. The power supply 299 is coupled to a supply voltage $V_{BATT}$ 210 to provide a supply voltage 208 to the PA 104. The PA controller 202 includes, among other components, an amplitude comparator 228, a deviation measuring module 216, and an error amplifier 288. The amplitude comparator 228 receives the RF input signal 204 and an attenuated 238 RF output signal 110 as attenuated by the attenuator 254. The attenuator 254 may be adjusted such that the output 110 of the PA 104 is attenuated to have an amplitude level corresponding to the amplitude level of the RF input signal 204. The RF input signal 204 and the attenuated RF output signal 238 are then fed to the amplitude comparator 228 to generate an amplitude error signal 218 indicative of the amplitude difference between the RF input signal 204 and the attenuated RF output signal 238. The deviation measuring module 216 measures the activity in the amplitude error signal 238 and generates a deviation signal 250 indicative of the distortion in the RF output signal 110 relative to the RF input signal 204. The deviation signal 250 is then compared with a distortion level control signal 212 defining the level of distortion allowed in the RF output signal 110.

During the operation of the RF transmitter circuit, the PA controller 202 finds the optimum level of supply voltage 208 by adjusting the supply voltage 208. If the supply voltage 208 to the PA 104 is initially higher than the optimum level, the supply voltage 208 to the PA 104 is decreased. As the supply voltage 208 is decreased, the operating point of the PA 104 approaches closer to a saturation point where there is less voltage headroom for the PA 104 to operate. This results in increased distortion in the RF output signal 110 which is shown as an increase in the measured activity of the amplitude error signal 218. The increase in amplitude error signal 218 leads to an increase in the deviation signal 250. When the distortion of the RF output signal 110 increases beyond the allowable level as defined by the predetermined distortion level control signal 212, the supply voltage control signal 224 from the error amplifier 352 is increased, causing the power supply 299 to provide a higher supply voltage 208 to the PA 104. When the supply voltage 208 is increased, the operating point of the PA 104 shifts away from the saturation point to an operating point where the PA 104 has more voltage headroom, resulting in a decrease of distortion in the RF output signal 110. This in turn leads to the decrease in the measured activity of the amplitude error signal 218 and decrease in the deviation signal 250. When the deviation signal falls 250 below the predetermined distortion level control signal 212, the supply voltage control signal 224 is now decreased, causing the power supply 299 to provide a lower supply voltage 208 to the PA 104. By increasing or decreasing the supply voltage 208, the supply voltage 208 is adjusted to an optimum voltage level where the distortion in the RF output signal 110 corresponds to a predetermined allowable level set by the distortion level control signal 212. The supply voltage 208 in essence operates as a bias control signal that controls the operating point of the PA 104.

The supply voltage 208 is adjusted optimally even when changes occur in the impedance of the circuitry receiving the RF output signal 110. The PA 104 may normally drive circuitry usually consisting of a filter and an antenna, with a typical impedance of 50 Ohms. However, if the antenna is touched or the cellular device is laid down on a metal surface, the load presented by the circuitry receiving the RF output signal 110 is changed, which changes the operating point of the PA 104. The optimum voltage level of the supply voltage 208 thus changes. The PA controller 202 then increases or decreases the supply voltage 208 to match the allowable distortion level set by the distortion control signal 212, to a new optimum voltage level as described above. Therefore, the PA controller 202 can maintain a high efficiency while maintaining the level of distortion in the RF output signal 110 even when the load presented to the PA 104 changes.

Both the output power as well as the PAR of the RF output signal 110 may change frequently in modern cellular systems. For example, UMTS mobiles may change transmit power levels at least once per 667 usec in a closed loop power control scheme controlled by the basestation, and additionally may handle transmit power bursts due to special control signaling at other times. UMTS mobiles also must accommodate transmit modulation PAR changes when the modulation scheme is changed to accommodate higher datarates. An increase in either the output power or PAR of the RF output signal 110 may cause the operating point of the PA 104 to move closer towards compression, resulting in a higher level of distortion. The PA controller 202 responds by increasing the supply voltage 208 until the distortion matches the allowable distortion level set by the distortion control signal 212, resulting in a new optimum voltage level as described above. A decrease in either the output power or PAR of the RF output signal similarly causes the PA controller 202 to respond by decreasing supply voltage 208. Thus, the PA controller 202 can maintain a high efficiency while maintaining the level of distortion in the RF output signal 110 even when the RF output power or PAR of the RF output signal 110 changes dynamically.

The components of the PA controller 202 may be enabled in intervals and disabled between the intervals to decrease the power consumption of the PA controller 202. That is, once the PA controller 202 has set the supply voltage 208, some of the components of the PA controller 202 may be disabled during periods when the operating conditions (e.g. output power, frequency, PAR, impedance mismatch) of the PA 104 remain approximately static while holding constant the supply voltage 208, thus decreasing the overall power consumption of the PA controller 202.

Further, the power consumption of the power supply 299 may be reduced during the periods when the PA controller 202 is disabled. Since the PA supply voltage 208 is held constant during this period, the PA power supply 299 may reduce its operating supply current and thus operate in a more efficient, reduced-bandwidth "slow" mode. During the intervals when the PA controller 202 is enabled, the power supply 299 may revert to operation in a "fast" mode in which it is capable of rapidly changing its output voltage 208 in response to the PA controller 202. In this mode, the power supply 299 may operate with higher supply current because it must support higher bandwidth required to rapidly slew the output voltage 208.

Adjusting the supply voltage 208 may cause some change in the gain of the PA 104. If the gain change causes an unwanted error in the power level at the RF output signal 110, the RF input signal 204 may be adjusted in amplitude to compensate the unwanted error, thus ensuring that the RF output signal 110 maintains an accurate power level. For example, the TXIC 102 may adjust the amplitude of its RF signal 204 based on a measurement of the power at the RF output signal 110 (measurement not shown). Alternatively, the PA 104 may be characterized so that the change in its gain is known for a change in the supply voltage 208, and thus the TXIC 102 may adjust the amplitude of its RF signal 204 based on this information and the supply voltage 208.

Figure 3A:
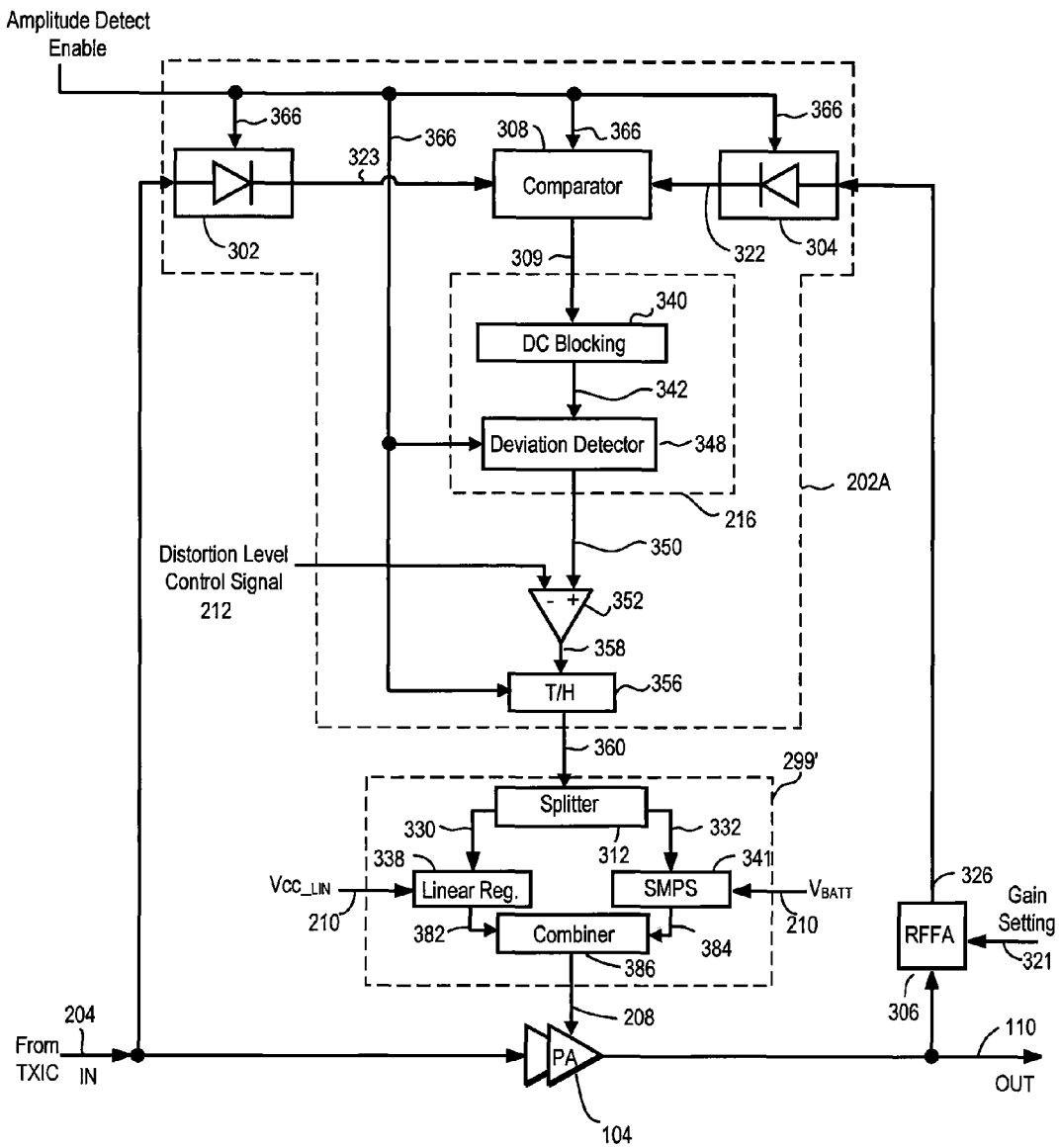
FIG. 3A illustrates an RF power amplifier system, in accordance with a first embodiment of the present invention.

FIG. 3A illustrates an RF PA system, according to a first embodiment of the present invention. The RF PA system includes, among other components, the PA 104, the PA controller 202A, an adjusted variable attenuator (RFFA (RF Feedback Attenuator)) 306, and a power supply 299'. The PA controller 381 includes, among other components, a comparator 308, a DC blocking module 340, a deviation detector 348, an error amplifier 352, a track and hold (T/H) module 356, and two matched amplitude detectors 302, 304. The power supply 299' may include a splitter 312, a linear regulator 338, a switched-mode power supply (SMPS) 341, and a power combiner 386.

Referring to FIG. 3A, the amplitude of the RF input signal 204 is monitored through the amplitude detector 302 and compared by the comparator 308 with the amplitude of the RF input signal 110 as attenuated 326 by the adjusted variable attenuator (RFFA) 306, seen through a matched amplitude detector 304. Note that the amplitude detectors 302, 304 and the comparator 308 of FIG. 3A correspond to the amplitude comparator 228 of FIG. 2. The attenuator 306 may be adjusted such that the output 110 of the PA 104 is attenuated to have an amplitude level corresponding to the amplitude level of the RF input signal 204. This can be achieved through programming 321 the variable attenuator (RFFA) 306 by either a digital input to the PA controller 202 or by analog control of the variable attenuator (RFFA) 306.

In this example, amplitude detectors 302 and 304 are log detectors. That is, the amplitude detectors 302, 304 detect the logarithm 323 of the amplitudes of the RF input signal 204 and the logarithm 322 of the attenuated 326 RF output signal 110, to generate the logarithm of the respective amplitudes 322, 323 at input and output of the PA 104. It should be understood that an approximation to logarithm may result from a practical implantation in the system.

Therefore, in this example, the comparator 308 generates an amplitude error signal 309 indicating the difference between the logarithm 323 of the amplitude of the RF input signal 204 to the PA 104 and the logarithm 322 of the amplitude of the attenuated version 326 of the RF output signal 110. Thus, the activity of amplitude error signal 309 is a measure of the distortion generated by the PA. Note that a benefit of the comparator 308 generating the difference between the logarithms of the amplitudes, rather than the difference between amplitudes, can be seen from the equations below:

CASE 1: COMPARATOR 308 GENERATES DIFFERENCE BETWEEN AMPLITUDES:

$$cout(t)=s(t)-A*(s(t)+e(t))$$

CASE 2: COMPARATOR 308 GENERATES DIFFERENCE BETWEEN LOGARITHMS OF AMPLITUDES:

$$cout(t) = \log(A*(s(t)+c(t)) - \log s(t)$$
$$= \log A + \log(s(t)+e(t)) - \log s(t)$$
$$= \log A + \log(s(t)+c(t)/s(t))$$

where cout(t) is the amplitude error signal 309, s(t) is the RF input signal 204, A is the static ratio between the amplitudes of the RF input signal 204 and attenuated RF output signal 326 as detected by detectors 302, 304, and e(t) is the error added by the PA 104 to the RF input signal 204. If the RFFA 306 is adjusted accurately such that the RF output signal 110 of the PA 104 is attenuated to have an amplitude level corresponding to the amplitude level of the RF input signal 204, the value of A approaches 1. In CASE 1, any deviation from A=1 affects the amplitude error signal 309 cout(t), thus requiring the RFFA 306 to be accurately adjusted to discern an accurate estimation of distortion by the deviation detector 348. In CASE 2, the term log A, which is a DC (Direct Current) term, can be removed by a highpass filter. Thus, the AC (Alternating Current) components at the amplitude error signal 309 can be used by deviation detector 348 to produce an accurate representation of the distortion, even if the RFFA 306 is not accurately adjusted.

The DC blocking module 340 and the deviation detector 348 of FIG. 3A function as the deviation measuring module 216 as illustrated in FIG. 2. Specifically, the amplitude error signal 309 is fed into the DC blocking module 340. The DC blocking module 340 blocks DC components of the amplitude error signal 309 and passes AC components 342 of the amplitude error signal 309. The AC components 342 are indicative of the activity in the amplitude error signal 309. Note that the AC components 342 that pass the DC blocking module 340 may not be all of the AC components of the amplitude error signal 309 because the DC blocking module 340 may block or attenuate part of the AC components of the amplitude error signal 309 in addition to the DC component of the amplitude error signal 309. The AC components 342 from the DC blocking module 340 are provided to the deviation detector 348.

The deviation detector 348 generates a deviation signal 350 from the AC components 342 of the amplitude error signal 309. The deviation signal 350 represents the activity in the amplitude error signal 309. In one example, the deviation signal 350 is an averaged magnitude of the AC components 342 of the amplitude error signal 309 over a certain amount of time. In this case, a circuit which rectifies the AC components 342 of the amplitude error signal 309, followed by a lowpass filter may be used as the deviation detector 348, for example. The cutoff frequency of the lowpass filter must be chosen to settle quickly while providing sufficient averaging to ensure a consistent result. In another example, the deviation signal 350 is a peak excursion of the AC components 342 of the amplitude error signal 309 over a certain amount of time. The peak excursion refers to the magnitude of the highest crest or the lowest trough of the AC components 342 within a certain amount of time. In yet another example, the deviation signal 350 is generated from the AC components using a combination of both the averaged value and the peak excursion. Note that other methods may be used to obtain the deviation signal 350 from the AC components 342.

The accuracy of the deviation detector 348 in representing the level of distortion at the RF output signal 110 is degraded somewhat by the delay between the RF input signal 204 and the RF output signal 110, caused primarily by the delay through the PA 104. During periods when the signal amplitude at the RF input 204 is changing very rapidly, this delay may result in a temporary peaking of the difference in amplitude between RF input signal 204 and RF output signal 110, which is detected by the comparator 308. This results in a corresponding peaking of the amplitude error signal 309. Since deviation signal 350 is based on the AC components 342 of the amplitude error signal 309, the deviation signal 350 may indicate a higher level of distortion than exists.

In this case, two methods may be used to improve the accuracy of the deviation signal 350. First, a delay (not shown) may be added to delay the detected amplitude of the input RF signal 204, such that this delay is approximately equal to the delay of the PA 104. The delay may be placed before or after amplitude detector 302. Thus, the RF input signal 204 to the PA 104 and the RF output signal 110 from the PA 104 are more accurately aligned in time, reducing the temporary peaking of the difference in amplitude between the RF input signal 204 and the RF output signal 110. This improves the accuracy of deviation signal 350. Second, large peaks in the difference in amplitude between RF input signal 204 and RF output signal 110, which generate peaking of amplitude error signal 309, may be ignored by the deviation detector 348. For example, a peak limiter may be used to limit the maximum level of amplitude error signal 309 to which the deviation detector 348 responds. Alternatively, since rapid amplitude changes may be associated with deep nulls in the amplitude modulation at RF input 204, deviation detector 348 may ignore or reduce its response to the AC components 342 of the amplitude error signal 309 during these periods. In either case, the accuracy of the deviation signal 350 is improved.

The error amplifier 352 compares the deviation signal 350 with the distortion level control signal 212 and generates a supply voltage control signal 358. The supply voltage control signal 358 may be filtered by a low pass filter (not shown) to provide stability to the control of the supply voltage 360. The supply voltage control signal 358 is then provided to the T/H module 356.

The T/H module 356 operates in a track mode when an amplitude detect enable signal 366 is active, and in a hold mode when the amplitude detect enable signal 366 is inactive. In the track mode, the T/H module 356 generates a track and hold signal (T/H signal) 360 that tracks the supply voltage control signal 358. In the hold mode, the T/H module 356 maintains the T/H signal 360 at a constant level. This constant level may be the same as the supply voltage control signal 358 at the most recent time the T/H module 356 transitions from the track mode to the hold mode.

The configuration for the T/H module 356 shown in FIG. 3A is just an example. Any configuration which allows power supply 299' to be controlled in two possible modes: (a) by the supply voltage control signal 358, or (b) by a fixed value such as the supply voltage control signal 358 at the most recent time the T/H module 356 transitions from the track mode to the hold mode, is allowed. For example, the T/H module 356 may alternatively be connected between the deviation detector 348 and the error amplifier 352.

The power supply 299' generates the supply voltage 208 based upon the track and hold signal 360 that tracks or holds the supply voltage control signal 358, and provides the supply voltage 208 to one or more supply voltage pins of the PA 104. Thus, the supply voltage 208 may be changed when the T/H module 356 operates in the track mode, and remains static when the T/H module 356 operates in the hold mode. Use of the T/H module 356 allows a reduction in the average power consumption of the PA controller 202, as described previously.

Typically, the power supply 299' will comprise a SMPS, to ensure an efficient delivery of power to PA 104. In some cases, it may be advantageous that the power supply 299' be capable of changing its voltage rapidly, while still maintaining an efficient power delivery. For example, in a UMTS system, when changes to either transmitted output power or PAR of the RF output signal 110 are required by the basestation, the mobile must make this change and settle to the specified new transmit power level and PAR in less than 50 usec, often while maintaining the specified peak code domain error (peak code domain error is a measure of transmitted signal distortion). Since a change to transmitted output power or PAR of the RF output signal 110 may cause power supply controller 202A to adjust the power supply 299' to a new supply voltage 208, the power supply 299' must be capable of adjusting this voltage within 50 usec, and may require that the voltage to be controlled during the change of transmitted output power or PAR of the RF output signal 110, to maintain an acceptable level of distortion in the RF output signal 110. In one example of the embodiment of FIG. 3A, the power supply 299' comprises two separate power controllers, the linear regulator 338 and the SMPS 341. The T/H signal 360 (corresponding to the supply voltage control signal 358 in the track mode) is split into two signals: a high frequency signal 330 that is fed into a high frequency path including the linear regulator 338, and a low frequency signal 332 that is fed into a low frequency path including the SMPS 341. The high frequency signal 330 is input to the linear regulator 338, which generates the high frequency part 382 of the supply voltage 208 from the supply voltage $V_{CC\_LIN}$ 210. The low frequency signal 332 is input to the SMPS 341, which generates the low frequency part 384 of the supply voltage 208 from the supply voltage $V_{BATT}$ 210. The linear regulator output 382 of the linear regulator 338 and the SMPS output 384 of the SMPS 341 are combined in the power combiner 386 to generate the supply voltage 208 to the PA 104. For example, a simple current adding node, a small, high frequency transformer or other types of active electronic solutions can be used as the power combiner 386. Any other types of power combiner circuits may be used as the power combiner 386. The power combiner 386 combines the high frequency part 382 and the low frequency part 384 to generate the supply voltage 208 to the PA 104.

The high frequency signal 330 is comprised of components of the T/H signal 360 higher than a predetermined frequency, and the low frequency signal 332 is comprised of components of the T/H signal 360 lower than the predetermined frequency. The predetermined frequency used to split the comparison signal 309 can be set at any frequency, but is preferably set at an optimum point where the efficiency of power supply 299' is acceptable and the supply voltage 208 responds to the supply voltage control signal 358 with sufficient speed. In some examples, the predetermined frequency may not be fixed but may be adjusted dynamically to achieve optimum performance of the RF transmitter system.

Note that the two path power supply 299' of FIG. 3A may be replaced by a simplified or more complex power supply. A simplified power supply with either a linear regulator or a SMPS may be used, although the efficiency of the RF transmitter system may be somewhat decreased. A more complex power supply further increasing the efficiency of the RF transmitter may also be used. For example, it is possible to split the amplitude correction signal 309 into more than two different frequency ranges for separate processing by adjustable power supply components.

In another example of the first embodiment, one or more components of the PA controller 202 are implemented by a digital signal processor (DSP). For example, the T/H module 356 is implemented by the DSP. Using the DSP as the T/H module 356 has the advantage that a hold signal from the DSP does not diminish with the progress of time unlike a hold signal from a T/H module implemented by a capacitor. Alternatively, the comparator 308, the DC blocking module 340, the deviation detector 348, the error amplifier 352, and the T/H module 356 may be replaced with the DSP. In this case, the DSP receives the amplitude 323 of the RF input signal 204 and the amplitude 322 of the RF output signal 110, and generates the supply voltage control signal 360. The DSP can also be advantageously used to implement additional signal processing and control schemes to increase the efficiency of the RF transmission system.

Figure 3B:
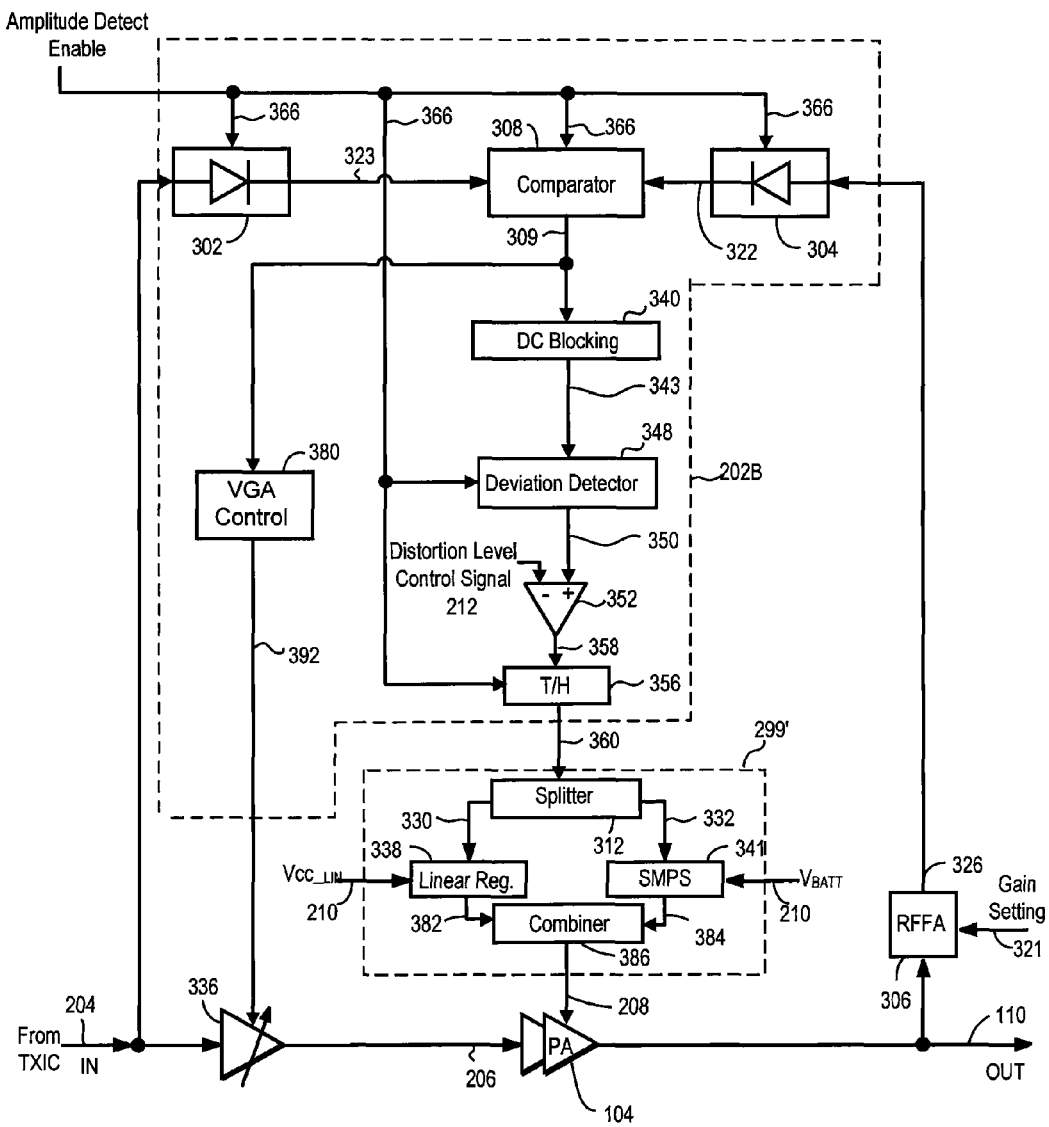
FIG. 3B illustrates an RF power amplifier system, in accordance with a second embodiment of the present invention.

FIG. 3B illustrates an RF PA system, according to a second embodiment of the present invention. In the embodiment of FIG. 3B, the PA controller 202B further includes a variable gain amplifier (VGA) 336. The VGA 336 is introduced in the RF signal path between an RF input 204 and a PA input 206. A VGA control module 380 is coupled to the comparator 308 to receive the amplitude error signal 309 to generate a gain control signal 392 based on the amplitude error signal 309. The VGA control module 380 may filter the amplitude error signal 309 to more stably control the VGA 336.

The VGA 336 receives the RF input signal 204 and generates the RF PA input signal 206. The VGA control module 380 generates a gain control signal 392, which controls the gain of the VGA 336 based upon the amplitude error signal 309 in a control loop that attempts to minimize the difference between the RF output signal 110 and an attenuated RF input signal 204. Thus, the gain of the RF output signal 110 relative to the RF input signal 204 is maintained constant, and the VGA 336 helps to form a closed loop that effectively performs linearization of the PA 104. The linearization of the PA 104 decreases the distortion of the RF output signal 110 from the PA 104. Therefore, when the VGA 336 is used, the supply voltage 208 to the PA 104 can be decreased more than when the VGA 336 is not used. This results overall increase in the efficiency of the RF transmitter system.

Like the first embodiment in FIG. 3A, various components of the PA controller 202B in FIG. 3B can be replaced with a DSP.

Figure 3C:
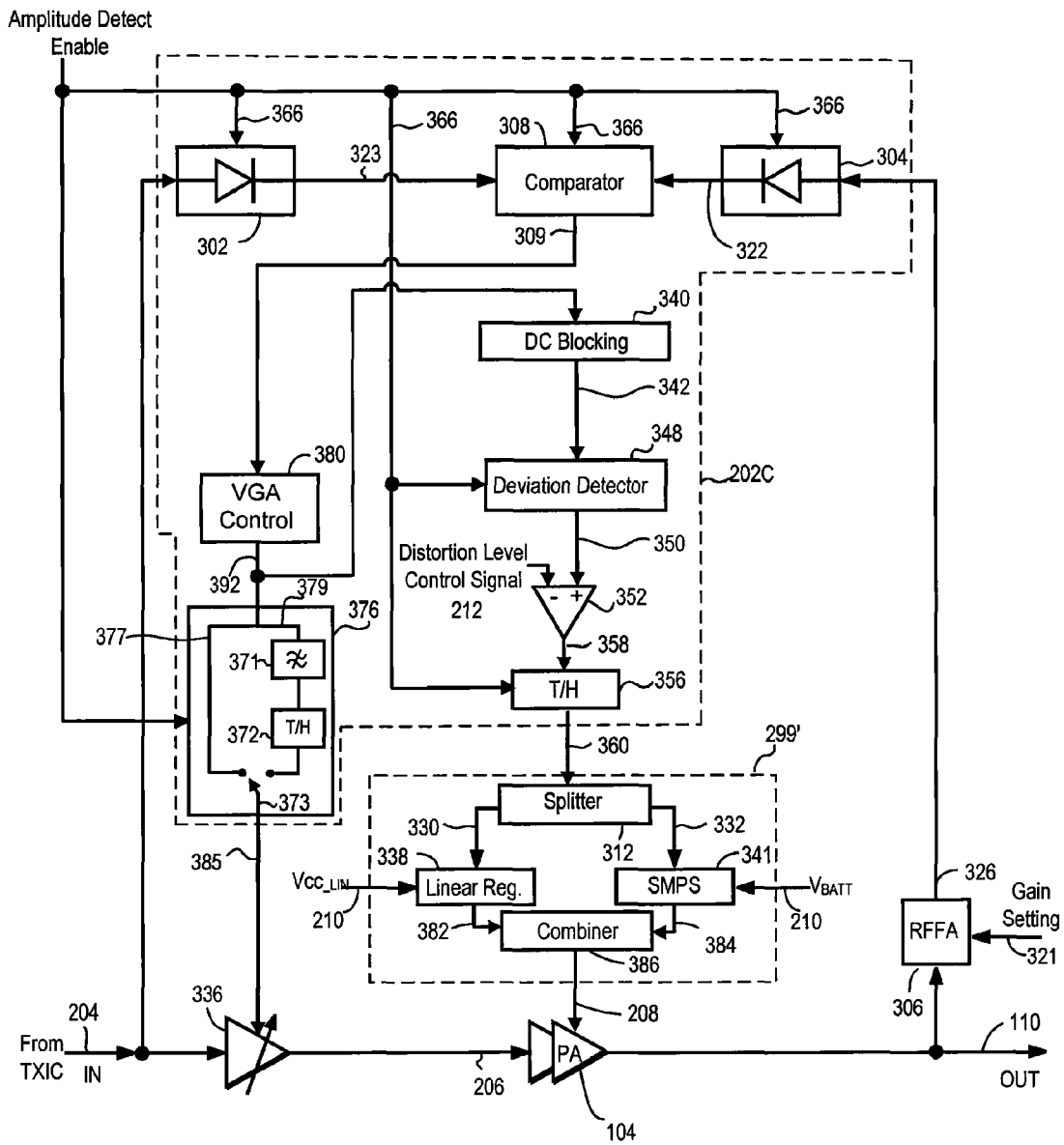
FIG. 3C illustrates an RF power amplifier system, in accordance with a third embodiment of the present invention.

FIG. 3C illustrates an RF PA system, according to a third embodiment of the present invention. The RF PA system illustrated in FIG. 3C is substantially the same as the RF transmitter circuit illustrated in FIG. 3B, except that (i) the amplitude error signal 309 is fed only to the VGA control module 380 and not to the DC blocking module 340, (ii) the gain control signal 392 is fed to the DC blocking module 340 in place of the amplitude error signal 309, and (iii) the PA controller 202C further includes a T/H module 376.

In the embodiment of FIG. 3C, the output signal 342 from the DC blocking module 340 is the AC components of the gain control signal 392. The gain control signal 392 is an amplified version of the amplitude error signal 309; and therefore, the function and operation of the DC blocking module 340, the deviation detector 348, the error amplifier 352, and the T/H module 356 are the same as the embodiment of FIG. 3B except that the gain control signal 392 is used in place of the amplitude error signal 309. Because the gain control signal 392 is an amplified version of the amplitude error signal 309, the gain control signal 392 has larger amplitude compared with the amplitude error signal 309. The embodiment of FIG. 3C is advantageous because the gain control signal 392 has a larger signal level which is easier to process compared to the amplitude error signal 309.

Additionally, the gain control signal 392 (via a T/H signal 385) may control VGA 336 in a linear-in-dB manner. That is, a linear change in signal level at the gain control signal 392 may result in a logarithmic (dB) change in the gain of the VGA 336. Thus, the gain control signal 392 is indicative of the difference between the logarithm of the amplitude 323 of the RF input signal 204 and the logarithm of the amplitude 322 of the attenuated RF output signal 326, and so offers similar advantages to those described for the amplitude error signal 309 indicating the difference between the logarithm of the amplitude 323 of the RF input signal 204 to the PA and the logarithm of the amplitude 322 of the RF output signal 110 as described above with reference to FIG. 3A. In this case, the AC components at comparator output 309 can be used by the deviation detector 348 to produce an accurate representation of the distortion, even if the RFFA 306 is not accurately adjusted.

In this example, the gain control signal 392 from the VGA control module 380 is provided to a T/H module 376. The T/H module 376 includes a switch 373, a lowpass filter 371, and a T/H component 372. The T/H module 376, like the T/H module 356 operates in a track mode when the amplitude detect enable signal 366 is active, and in a hold mode when the amplitude detect enable signal 366 is inactive. In the track mode, the switch 372 is coupled to a first path 377 so that the T/H module 376 outputs a T/H signal 385 that tracks the gain control signal 392. In the hold mode, the switch 372 is coupled to a second path 379 that includes the lowpass filter 371 and the T/H component 372. Note that the lowpass filter 371 may perform an averaging function, and the averaging period may be adjustable or fixed. Therefore, in the hold mode, the T/H component 372 maintains the T/H signal 385 same as the average value of the gain control signal 392, at the most recent time it transitions from the track mode to the hold mode. The T/H signal 385 is input to the VGA 336 to control the gain of the VGA 336.

The T/H module 376 provides two advantages. First, it may allow VGA 376 to operate at a lower average current. During the period when the amplitude detect enable signal 366 is active and the T/H module 376 is in track mode, the VGA control 380 and the VGA 336 together with other components of the RF power amplifier system form a closed loop that performs linearization of the PA 104, as described previously. During this time, the AC component of gain control signal 392 is used by the deviation detector 348 to determine an approximation of distortion at the RF output 110, and the supply voltage 208 may be adjusted during this interval. When the amplitude detect enable signal 366 is inactive and the T/H 376 is in hold mode, the VGA 336 may be held at a constant gain level, and thus the VGA 336 may be biased at a lower current suitable for this static level.

Second, during the T/H track mode, the averaged gain control signal 392, as monitored by the T/H module 376, corresponds to the average gain of VGA 336 required to maintain a constant gain of the RF output signal 110 relative to the RF input signal 204, compensating for gain changes in the PA 104 when the supply voltage 208 is adjusted. At the time when the T/H module 376 enters the hold mode, the gain of VGA 336 is fixed to the level corresponding to the recently averaged gain control signal 392, which corresponds to the gain required to compensate for the gain of PA 104 at that time. If the operating conditions for the PA 104 remain relatively static (e.g. with respect to output power, frequency, PAR, impedance mismatch), and the supply voltage 208 does not change because the T/H modules 356, 376 are both placed together into hold mode by the amplitude detect enable signal 366, this fixed gain of the VGA 336 is set properly for the period in the hold mode.

The details shown in FIG. 3C for the T/H module 376 are just an example. Any configuration which allows the gain of the VGA 336 to be controlled in two possible modes: (a) by the gain control signal 392, or (b) by a fixed value such as the averaged gain control signal, responsive to the amplitude detect enable signal 366, is allowed. For example, the lowpass filter 371 may be swapped with the T/H component 372.

Like the first embodiment in FIG. 3A, various components of the PA controller 202C of FIG. 3C can be replaced with a DSP.

The RF power amplifier systems depicted in FIGS. 3B and 3C may be combined in any way. For example, while FIG. 3B shows an RF power amplifier system without the T/H module 376 as shown in FIG. 3C, the T/H module 376 may be included in the system shown in FIG. 3B. In this case, the VGA 336 may be operated in a track or hold mode as described above with reference to the embodiment of FIG. 3B. While the VGA 336 no longer provides closed loop linearization as described previously during the hold mode, the VGA 336 does correct for gain changes in the PA 104 while the supply voltage 208 is adjusted.

In another example, FIG. 3C shows the gain control signal 392 feeding the DC blocking module 340. Alternatively, the amplitude error signal 309 may instead feed the DC blocking module 340. Thus, the deviation detector 348 may base its deviation signal 350 on the amplitude error signal 309.

Figure 4A:
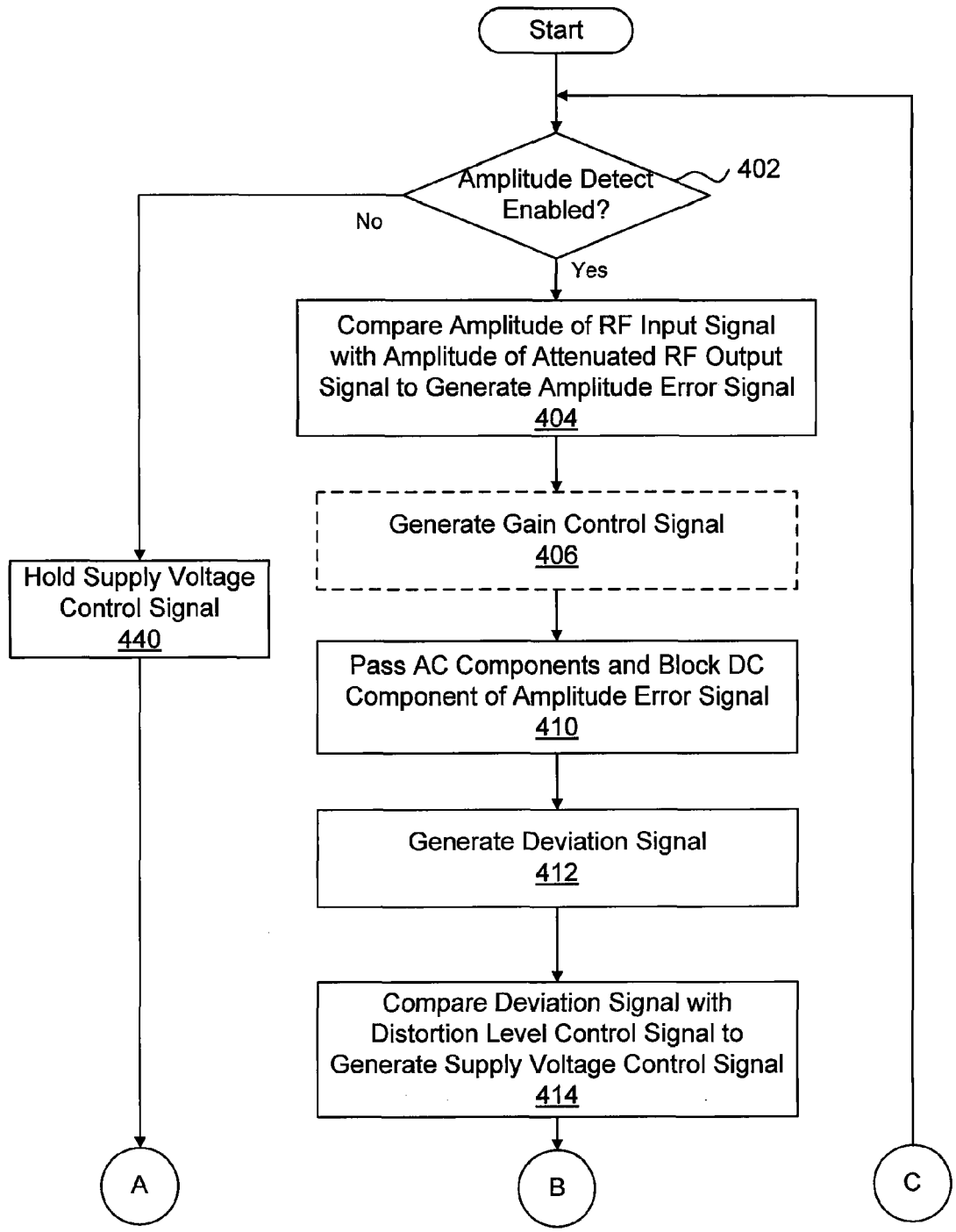
FIGS. 4A and 4B illustrate a method of controlling an RF power amplifier system, in accordance with the first and second embodiments of the present invention.
Figure 4B:
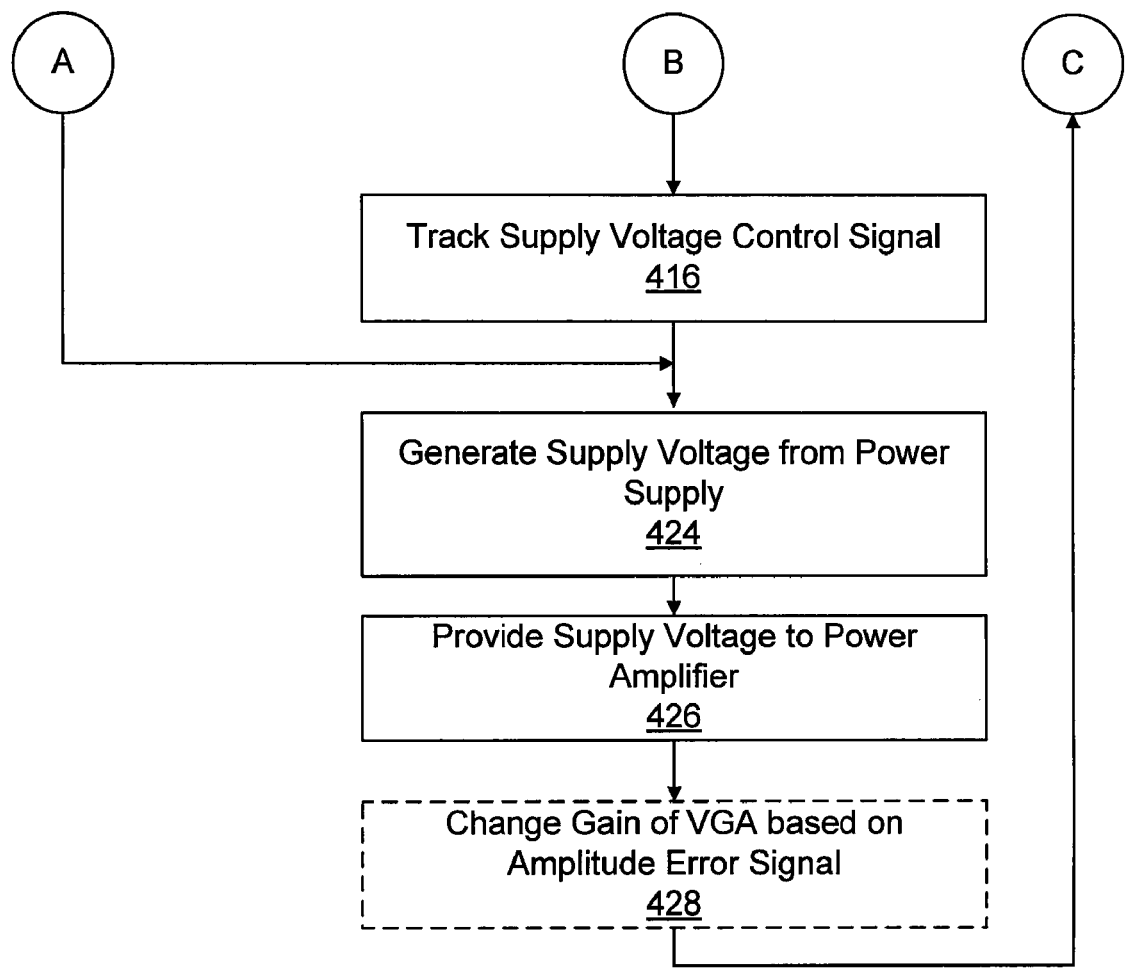

FIGS. 4A and 4B illustrate a method of controlling the RF PA system, according to the first and second embodiments of the present invention. Note that the processes common to the first and second embodiments are shown in blocks with solid lines whereas the processes performed by the second embodiment but not the first embodiment are shown in blocks with dashed lines.

In the first and second embodiments, the amplitude detect enable signal 366 is sensed to determine 402 whether the amplitude detect is active. In the first and second embodiments, if the amplitude detect is active, the amplitude of the RF input signal 204 and the attenuated amplitude of RF output signal 110 are compared to generate 404 the amplitude error signal 309. In the second embodiment, the amplitude error signal 309 is amplified (and filtered, if needed) to generate 406 the gain control signal 392. In the first embodiment, the step 406 is not carried out.

In the first and second embodiments, the DC blocking module 340 blocks 410 the DC component of the amplitude error signal 309 and passes 410 the AC components 342 of the amplitude error signal 309. Then, the deviation signal 350 is generated 412 from the AC components 342 of the amplitude error signal 309. The deviation signal 350 is then compared 414 with the distortion level control signal 212 to generate 414 the supply voltage control signal 358. The T/H module 356 generates the T/H signal 360 that tracks 416 the supply voltage control signal 358.

The supply voltage control signal 358 (in the form of the T/H signal 360) is provided to the power supply 299' to generate 424 the supply voltage 208. The supply voltage 208 is then provided 426 to the PA 104. In the second embodiment, the gain of the VGA is adjusted 428 based on the gain control signal 392. In the first embodiment, the step 428 is not carried out.

In the first embodiment, the process returns to the step 402 after finishing the step 424. In the second embodiment, the process returns to step 402 after finishing the step 428. Note that the steps 406 and 428 can be performed in parallel with steps 410 through 426.

If it is determined in step 402 that amplitude detect is inactive, the process proceeds to hold 440 the supply voltage control signal 358 at the most recent value at the track mode before the transition. Then the process proceeds to the step 418 of splitting the T/H signal 360.

Figure 5A:
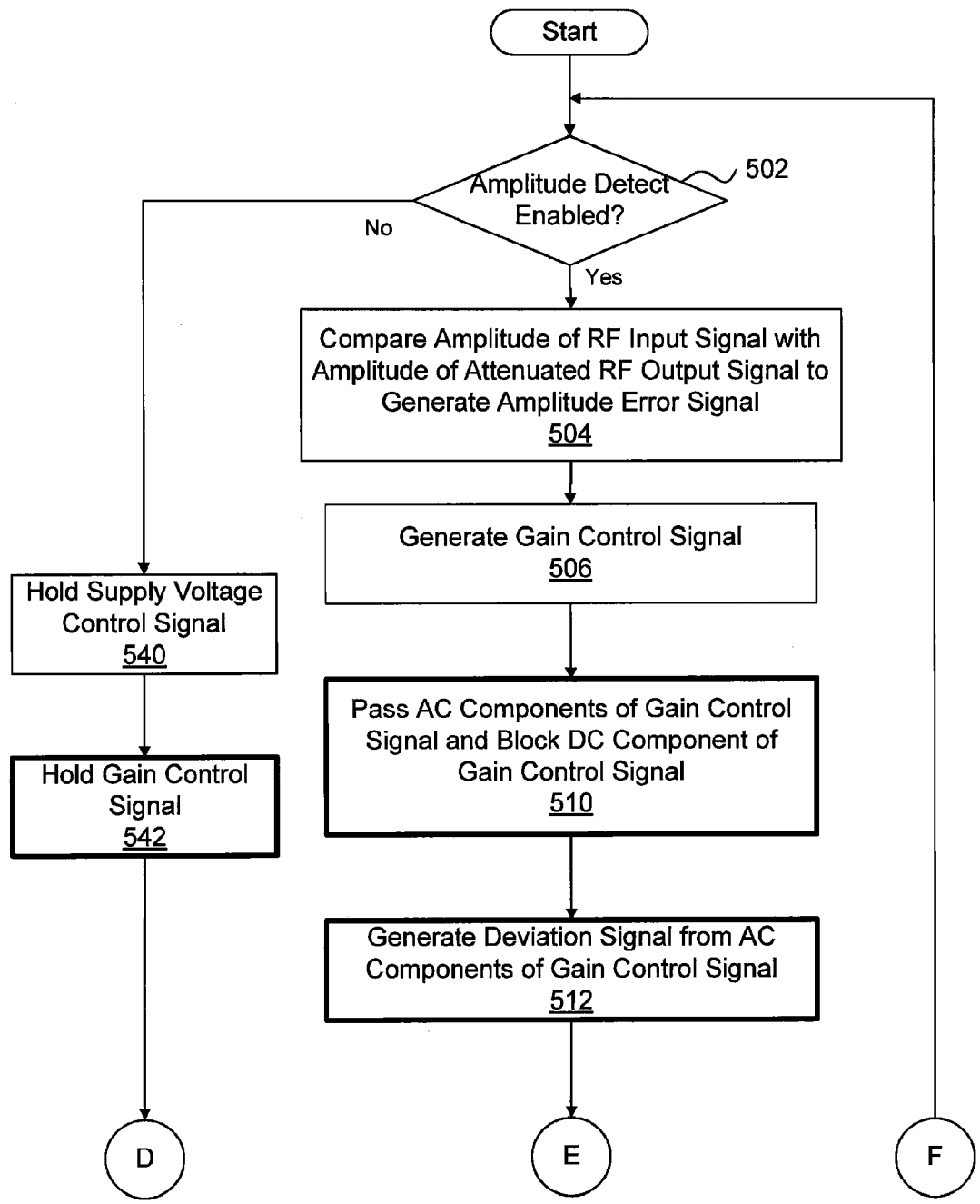
FIGS. 5A and 5B illustrate a method of controlling an RF power amplifier system, in accordance with the third embodiment of the present invention.
Figure 5B:
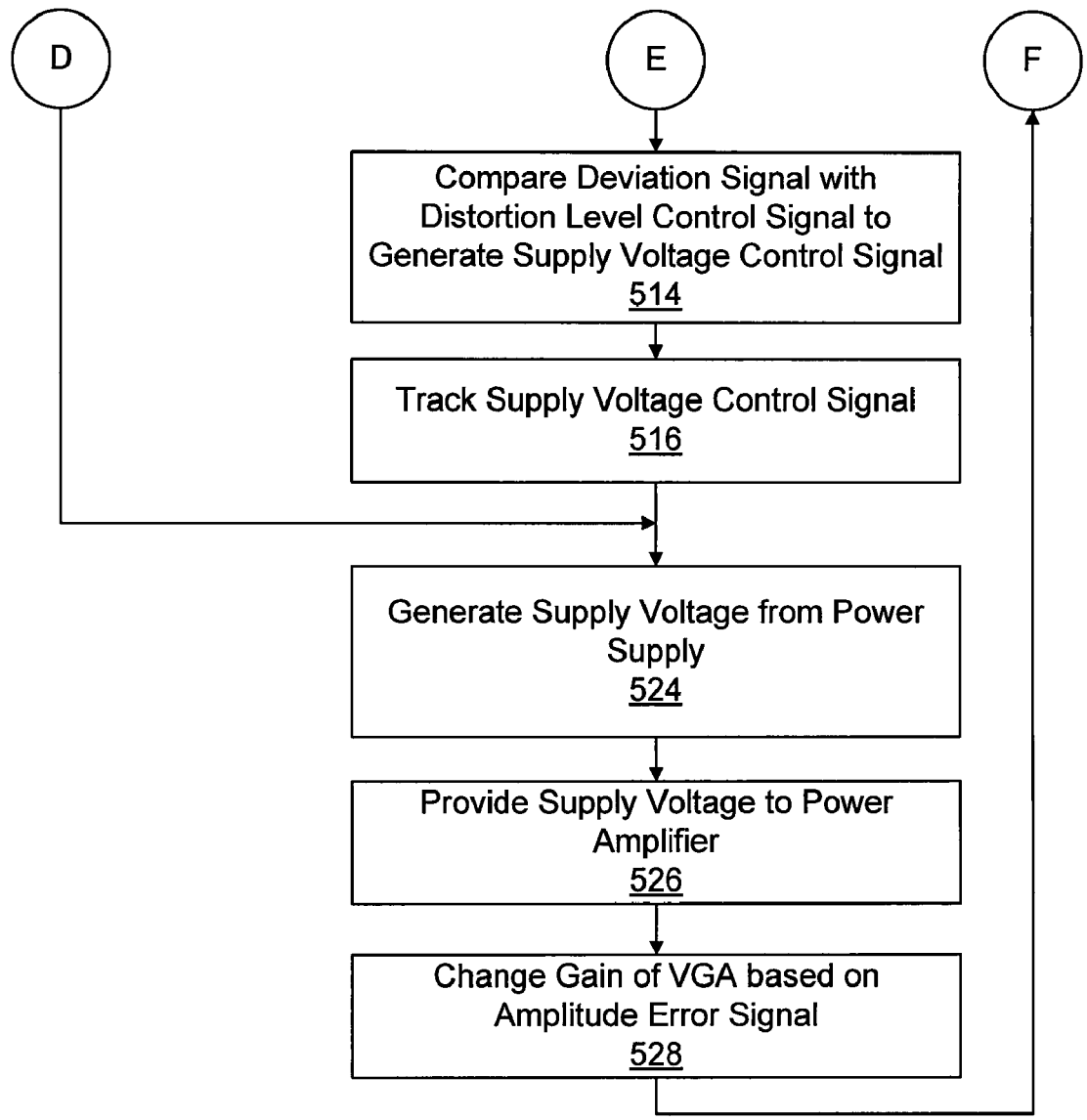

FIGS. 5A and 5B illustrate a method of controlling the RF PA system, according to the third embodiment of the present invention. The method illustrated in FIGS. 5A and 5B is substantially the same as the method illustrated in FIGS. 4A and 4B, except that (i) the AC Components 343 of the gain control signal 392 (instead of the amplitude error signal 309 as in the first and second embodiments) is filtered in step 510, that (ii) the deviation signal 350 is generated from the AC components of the gain control signal 392 (instead of the amplitude error signal 309 as in the first and second embodiment) in step 512, and that (iii) the gain control signal is held when the amplitude detection is disabled in step 542. All the other steps in the method according to the second embodiment in FIGS. 5A and 5B are substantially the same as the method according to the first and second embodiments in FIGS. 4A and 4B. Note that the steps in FIGS. 5A and 5B different from the steps of FIGS. 4A and 4B are shown in blocks with bold solid lines.

Upon reading this disclosure, those of skill in the art will appreciate still additional alternative structural and functional designs for the RF power amplifier controller through the disclosed principles of the present invention. For example, the T/H module can be coupled to the deviation detector to track and hold the deviation signal instead of the supply voltage control signal. The power amplifier controller circuit can be used with any type of power amplifier for many different types of electronic devices, although the embodiments are described herein with respect to a RF PA controller used in cellular telephone applications. Examples of these applications include video signals and Manchester coded data transmissions. For another example, digital techniques can be used to process some of the signals of the PA system described herein. Whether a signal is represented in an analog form or a digital form will not change the functionality or principles of operation of the PA system according to various embodiments of the present invention.

Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A radio frequency (RF) power amplifier system, comprising:
    a power amplifier coupled to receive and amplify an RF input signal to generate an RF output signal; and
    a power amplifier controller coupled to the power amplifier for controlling a supply voltage to the power amplifier,
    the supply voltage adjusted based on a difference between a deviation signal and a distortion level control signal,
    the deviation signal based on an error signal representing a difference between the RF input signal and the RF output signal, and
    the distortion level control signal corresponding to an allowable distortion level in the RF output signal.

2. The RF power amplifier system of claim 1, wherein the supply voltage is adjusted in intervals, and maintained constant between the intervals.

3. The RF power amplifier system of claim 2, wherein power of the RF input signal is adjusted to compensate for a change of gain of the power amplifier responsive to the supply voltage being adjusted.

4. The RF power amplifier system of claim 2, wherein the power amplifier controller comprises a track and hold module, the track and hold module in a track mode providing a track and hold signal that tracks the difference between a deviation signal and a distortion level control signal, and the track and hold module in a hold mode maintaining the track and hold at a constant level, wherein the track and hold module transitions between the track mode and the hold mode responsive to an enable signal.

5. The RF power amplifier system of claim 2, further comprising a power supply coupled between the power amplifier and the power amplifier controller to provide the supply voltage to the power amplifier based on the difference between a deviation signal and a distortion level control signal, wherein:
    the power supply operates in a fast mode in which the power supply output voltage is adjustable at a first rate using a first supply current, the power supply operating in the fast mode during the intervals for adjusting the supply voltage; and
    the power supply operates in a slow mode in which the power supply output voltage is adjustable at a second rate using a second supply current, the second rate slower than the first rate, the second supply current lower than the first supply current, the power supply operating in the slow mode during times the supply voltage is maintained constant.

6. The RF power amplifier system of claim 1, wherein the power amplifier controller comprises:
    a comparator for generating the error signal based on the difference between a logarithm of an amplitude of the RF input signal and a logarithm of an amplitude of the RF output signal;
    a DC blocking module coupled to the comparator, the DC blocking module passing AC components of the error signal and blocking a DC component of the error signal;
    a deviation detector generating the deviation signal based on the AC components of the error signal; and
    an error amplifier coupled to the deviation detector for comparing the deviation signal with the distortion level control signal.

7. The RF power amplifier system of claim 6, wherein the deviation detector generates the deviation signal based on an average of the magnitude of the AC components of the error signal.

8. The RF power amplifier system of claim 6, wherein the deviation detector generates the deviation signal based on a peak excursion of the AC components of the error signal.

9. The RF power amplifier system of claim 6, further comprising a power supply coupled to receive the difference between a deviation signal and a distortion level control signal, the power supply comprising:
    a first power supply with a first adjustment speed generating a first adjusted supply output based on the difference between a deviation signal and a distortion level control signal; and
    a second power supply with a second adjustment speed higher than the first adjustment speed, the second power supply generating a second adjusted supply output based on the difference between a deviation signal and a distortion level control signal, a combination of the first adjusted supply output and the second adjusted supply output forming the supply voltage to the power amplifier.

10. The RF power amplifier system of claim 1 wherein the power amplifier controller comprises a digital signal processor (DSP) generating the supply voltage based on the error signal.

11. The RF power amplifier system of claim 1, further comprising:
    a variable gain amplifier (VGA) coupled to the power amplifier for adjusting an amplitude of the RF input signal based upon a gain control signal, the gain control signal adjusting the gain of the VGA in order to maintain constant amplitude difference between the RF output signal and the RF input signal.

12. The RF power amplifier system of claim 11, wherein the difference between a deviation signal and a distortion level control signal is adjusted in intervals, and maintained constant between the intervals.

13. The RF power amplifier system of claim 12, further comprising a first track and hold module, the first track and hold module in a track mode providing a first track and hold signal that tracks the difference between a deviation signal and a distortion level control signal, and the first track and hold module in a hold mode maintaining the first track and hold signal at a constant level, wherein the track and hold module transitions between the track mode and the hold mode responsive to an enable signal.

14. The RF power amplifier system of claim 12, further comprising a power supply coupled between the power amplifier and the power amplifier controller to provide the supply voltage to the power amplifier, wherein:
    the power supply operates in a fast mode in which the power supply output voltage is adjustable at a first rate using a first supply current, the power supply operating in the fast mode during the intervals for adjusting the supply voltage; and
    the power supply operates in a slow mode in which the power supply output voltage is adjustable at a second rate using a second supply current, the second rate slower than the first rate, the second supply current lower than the first supply current, the power supply operating in the slow mode during times the supply voltage is maintained constant.

15. The RF power amplifier system of claim 13, further comprising a second track and hold module, the second track and hold module in a track mode providing a second track and hold signal that tracks the gain control signal allowing a gain of the gain control signal to be adjusted, and the second track and hold module in a hold mode maintaining the second track and hold signal at a constant level, wherein the second track and hold module transitions between the track mode and the hold mode responsive to the enable signal.

16. The RF power amplifier system of claim 11, wherein the power amplifier controller comprises;
   a comparator for generating the error signal based on difference between a logarithm of an amplitude of the RF input signal and a logarithm of an amplitude of the RF output signal;
   a DC blocking module coupled to the comparator, the DC blocking module passing AC components of the error signal and blocking a DC component of the error signal;
   a deviation detector generating the deviation signal based on the AC components of the error signal;
   an error amplifier coupled to the deviation detector for comparing the deviation signal with the predetermined distortion level control signal to generate the difference between a deviation signal and a distortion level control signal; and
   a VGA control coupled to the comparator and the VGA, the VGA control generating a gain control signal based on the error signal.

17. A radio frequency (RF) power amplifier system, comprising:
   a power amplifier coupled to receive and amplify an RF input signal to generate an RF output signal;
   a variable gain amplifier (VGA) coupled to the power amplifier for adjusting the RF input signal based upon a gain control signal, the gain control signal adjusting the gain of the VGA in order to maintain constant difference between the RF output signal and the RF input signal;
   a power amplifier controller coupled to the power amplifier for controlling a supply voltage to the power amplifier; and
   the supply voltage adjusted based on a difference between a deviation signal and a distortion level control signal, the deviation signal based on a time-varying change of gain of the VGA, the distortion level control signal corresponding to an allowable distortion level in the RF output signal.

18. The RF power amplifier system of claim 17, wherein the power amplifier controller further comprises:
   a comparator for generating the error signal based on the difference between a logarithm of an amplitude of the RF input signal and a logarithm of an amplitude of the RF output signal;
   a DC blocking module coupled to the VGA control, the DC blocking module passing the AC components of the gain control signal and blocking a DC component of the gain control signal;
   a deviation detector generating the deviation signal based on the AC components of the gain control signal;
   an error amplifier coupled to the deviation detector for comparing the deviation signal with the predetermined distortion level control signal and
   a VGA control coupled to the comparator and the VGA for generating the gain control signal based on the error signal, a linear change in gain control signal causing a logarithmic change in the gain of the VGA.

19. The RF power amplifier system of claim 18, wherein the deviation detector generates the deviation signal based on an average of magnitude of the AC components of the gain control signal.

20. The RF power amplifier system of claim 18, wherein the deviation detector generates the deviation signal based on a peak excursion of the AC components of the gain control signal.

21. The RF power amplifier system of claim 18, the power amplifier controller further comprising a power supply coupled to receive the supply voltage control signal, the power supply comprising:
   a first power supply with a first adjustment speed generating a first adjusted supply output based on the difference between a deviation signal and a distortion level control signal; and
   a second power supply with a second adjustment speed higher than the first adjustment speed, the second power supply generating a second adjusted supply output based on the difference between a deviation signal and a distortion level control signal, a combination of the first adjusted supply output and the second adjusted supply output forming the supply voltage to the power amplifier.

22. The RF power amplifier system of claim 17, wherein the difference between a deviation signal and a distortion level control signal is adjusted in intervals, and maintained constant between the intervals.

23. The RF power amplifier system of claim 22, further comprising a track and hold module, the track and hold module in a track mode providing a track and hold signal that tracks the supply voltage control signal, and the track and hold module in a hold mode maintaining the track and hold signal at a constant level, wherein the track and hold module transitions between the track mode and the hold mode responsive to an enable signal.

24. The RF power amplifier system of claim 23, further comprising a power supply coupled between the power amplifier and the power amplifier controller to provide the supply voltage to the power amplifier based on the difference between a deviation signal and a distortion level control signal, wherein:
   the power supply operates in a fast mode in which the power supply output voltage is adjustable at a first rate using a first supply current, the power supply operating in the fast mode during the intervals for adjusting the supply voltage; and
   the power supply operates in a slow mode in which the power supply output voltage is adjustable at a second rate using a second supply current, the second rate slower than the first rate, the second supply current lower than the first supply current, the power supply operating in the slow mode during times the supply voltage is maintained constant.

25. The RF power amplifier system of claim 23, further comprising a second track and hold module, the second track and hold module in a track mode providing a second track and hold signal that tracks the gain control signal allowing a gain of the gain control signal to be adjusted, and the second track and hold module in a hold mode maintaining the second track and hold signal at a constant level, wherein the second track and hold module transitions between the track mode and the hold mode responsive to the enable signal.

26. The RF power amplifier system of claim 17 wherein the power amplifier controller comprises a digital signal processor (DSP) for generating the supply voltage control signal based on the gain control signal.

27. A method of amplifying an RF input signal using a power amplifier, comprising:
- amplifying the RF input signal by the power amplifier to generate an RF output signal;
- generating an error signal based on a difference between the RF input signal and a RF output signal;
- generating a supply voltage control signal based on a difference between a deviation signal and a distortion level control signal, the deviation signal based on a measured level of activity of the error signal; and
- adjusting a supply voltage to the power amplifier based on the supply voltage control signal.

28. The method of claim 27, wherein the supply voltage is adjusted in intervals, and maintained constant between the intervals.

29. The method of claim 27 wherein the step of generating the supply voltage is performed by a digital signal processor (DSP).

30. The method of claim 27 further comprising:
- adjusting the RF input signal based upon a gain control signal; and
- adjusting the gain control signal to maintain constant the difference between the RF output signal and the RF input signal.

31. A method of amplifying an RF input signal using a power amplifier, comprising:
- amplifying the RF input signal by the power amplifier to generate an RF output signal;
- adjusting the RF input signal by a variable gain amplifier (VGA) based on a gain control signal to maintain constant a difference between the RF output signal and the RF input signal;
- generating an error signal based on a difference between the RF input signal and a RF output signal; and
- adjusting a supply voltage to the power amplifier based on a difference between a deviation signal and a distortion level control signal, the distortion level control signal corresponding to an allowable distortion level in the RF output signal.

32. The method of claim 31, wherein the supply voltage control signal is adjusted in intervals, and maintained constant between the intervals.

33. The method of claim 31 wherein the step of adjusting the supply voltage is performed by a digital signal processor.

* * * * *